US009520451B2

(12) United States Patent
Lan et al.

(10) Patent No.: US 9,520,451 B2
(45) Date of Patent: Dec. 13, 2016

(54) ORGANIC LIGHT-EMITTING DIODE DISPLAY DEVICE AND METHOD OF MANUFACTURING THE SAME

(71) Applicant: E Ink Holdings Inc., Hsinchu (TW)

(72) Inventors: Wei-Chou Lan, Hsinchu (TW); Ted-Hong Shinn, Hsinchu (TW); Xue-Hung Tsai, Hsinchu (TW); Chi-Liang Wu, Hsinchu (TW); Chih-Hsiang Yang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 18 days.

(21) Appl. No.: 14/464,703

(22) Filed: Aug. 20, 2014

(65) Prior Publication Data

US 2015/0137091 A1 May 21, 2015

(30) Foreign Application Priority Data

Nov. 18, 2013 (TW) ............................ 102141899 A

(51) Int. Cl.
*H01L 27/32* (2006.01)
*H01L 51/56* (2006.01)
(Continued)

(52) U.S. Cl.
CPC ....... *H01L 27/3244* (2013.01); *H01L 27/1255* (2013.01); *H01L 51/5284* (2013.01);
(Continued)

(58) Field of Classification Search
CPC .................... H01L 21/02365; H01L 21/02436; H01L 21/02518; H01L 27/28; H01L 27/32; H01L 27/3241; H01L 27/3225; H01L 31/0203; H01L 51/5281; H01L 27/3244; H01L 51/56; H01L 51/5287; H01L 27/1255; H01L 2227/323; H01L 51/5284; H01L 27/326; H01L 27/3276
See application file for complete search history.

(56) References Cited

U.S. PATENT DOCUMENTS 4,377,631 A * 3/1983 Toukhy .................... C08G 8/24 430/165
8,237,356 B2 8/2012 Cho et al.
(Continued)

FOREIGN PATENT DOCUMENTS

TW 200634946 A 10/2006

OTHER PUBLICATIONS

Corresponding Taiwanese Office Action that this art reference was cited on Sep. 24, 2015.

*Primary Examiner* — Julio J Maldonado
*Assistant Examiner* — Farun Lu
(74) *Attorney, Agent, or Firm* — CKC & Partners Co., Ltd.

(57) ABSTRACT

An organic light-emitting diode display device includes a substrate, a light-absorption layer, an active array structure, and an organic light-emitting diode. The substrate has a first and a second surface opposite to each other. The light-absorption layer is disposed on the first surface, and has at least one opening exposing a portion of the first surface. The active array structure is positioned on the second surface, and includes at least one data line, at least one gate line, and at least one switching device electrically connected to the gate and data lines. The light-absorption layer overlaps at least one of the data line and the gate line when viewed in a direction perpendicular to the substrate. The organic light-emitting diode is electrically connected to the switching device, and the organic light-emitting diode overlaps the opening when viewed in the direction perpendicular to the substrate.

6 Claims, 6 Drawing Sheets

100

Z W1
150(150R) 131 150(150G) 131 150(150B)
160
D
130
112
110
111
122 A 120 122 120
W2

(51) Int. Cl.
*H01L 51/52* (2006.01)
*H01L 27/12* (2006.01)

(52) U.S. Cl.
CPC .......... *H01L 51/5287* (2013.01); *H01L 51/56* (2013.01); *H01L 27/326* (2013.01); *H01L 27/3276* (2013.01); *H01L 2227/323* (2013.01)

(56) References Cited

U.S. PATENT DOCUMENTS

| | | | |
|---|---|---|---|
| 8,237,690 B2 | 8/2012 | Tomida | |
| 8,242,687 B2 | 8/2012 | Kanatani et al. | |
| 8,304,265 B2 | 11/2012 | Nakamura et al. | |
| 8,362,469 B2 | 1/2013 | Suh | |
| 8,373,624 B2 | 2/2013 | Chan et al. | |
| 2002/0135281 A1* | 9/2002 | Goda | C03C 17/007 313/112 |
| 2006/0113598 A1* | 6/2006 | Chen | H01L 21/76898 257/347 |
| 2006/0197458 A1* | 9/2006 | Winters | G09G 3/3233 315/169.1 |
| 2007/0210706 A1 | 9/2007 | Song | |
| 2008/0290790 A1 | 11/2008 | Jin | |
| 2010/0007270 A1* | 1/2010 | Suh | H01L 27/322 313/504 |
| 2012/0104430 A1 | 5/2012 | Kim et al. | |
| 2012/0138966 A1 | 6/2012 | Shin | |
| 2012/0168796 A1 | 7/2012 | Moon | |
| 2012/0211754 A1 | 8/2012 | Park | |
| 2012/0249454 A1 | 10/2012 | Teraguchi et al. | |
| 2012/0274672 A1 | 11/2012 | Tomida | |
| 2012/0280612 A1 | 11/2012 | Lee et al. | |
| 2012/0319122 A1* | 12/2012 | Ma | H01L 51/5284 257/72 |
| 2013/0038205 A1 | 2/2013 | Nakamura et al. | |
| 2013/0075744 A1 | 3/2013 | Shiobara et al. | |

* cited by examiner

ORGANIC LIGHT-EMITTING DIODE DISPLAY DEVICE AND METHOD OF MANUFACTURING THE SAME

RELATED APPLICATIONS

This application claims priority to Taiwanese Application Serial Number 102141899, filed Nov. 18, 2013, which is herein incorporated by reference.

BACKGROUND

Technical Field

The present disclosure relates to an organic light-emitting diode display device and a method of manufacturing the same.

Description of Related Art

Organic light-emitting diodes (OLEDs) are light-emitting devices driven by electrical current. An organic light-emitting diode display device is this kind of display which uses OLEDs as light-emitting devices, and therefore an organic light-emitting diode display device is a self-luminous display. Organic light-emitting diode display devices are regarded as the best choice for replacing liquid crystal displays because they have the advantages of having a wide viewing angle, a high contrast ratio, and a high response speed. Different from the common liquid crystal displays, the organic light-emitting diode display devices in nature do not require a polarizer to achieve their display functions. Hence, the outer surface of the organic light-emitting diode display device is generally smooth and flat. When light is projected from environment to the outer surface of the organic light-emitting diode display device, the incident light is reflected from the surface of the organic light-emitting diode display device to the viewer, thus interfering with the displayed image seen by users. According to the prior art, a polarizer or an anti-reflection film is attached to the otter surface of the organic light-emitting diode display device to resolve the problem mentioned above.

SUMMARY

An organic light-emitting diode display device is provided. The organic light-emitting diode display device comprises a substrate, a light-absorption layer, an active array, and an organic light-emitting diode. The substrate has a first surface and a second surface opposite to the first surface. The light-absorption layer is disposed on the first surface. The light-absorption layer has at test one opening exposing a portion of the first surface. An active array structure is positioned on the second surface and comprises at least one data line, at least one gate line, and at least one switching device electrically connected to the gate line and the data line. A projection of the light-absorption layer on the substrate overlaps at least one of a projection of the data line and a projection of the gate line on the substrate in a direction perpendicular to the substrate. The organic light-emitting diode is electrically connected to the switching device. A projection of the organic light-emitting diode on the substrate overlaps a projection of the opening on the substrate in the direction perpendicular to the substrate.

According to one embodiment of the present disclosure, the active array structure further comprises at least one driving line and at least one driver transistor. The driver transistor electrically interconnects the driving line and the organic light-emitting diode. The projection of the light-absorption layer on the substrate overlaps a projection of the driving line on the substrate in the direction perpendicular to the substrate.

According to one embodiment of the present disclosure, the active array structure further comprises at least one capacitor line and at least one capacitor structure connected to the capacitor line. The switching device has a drain electrode connected to the capacitor structure. The projection of the light-absorption layer on the substrate overlaps a projection of the capacitor line on the substrate in the direction perpendicular to the substrate.

According to one embodiment of the present disclosure, the organic light-emitting diode comprises a first electrode, a second electrode, and an organic light-emitting layer disposed between the first electrode and the second electrode. The first electrode is positioned between the organic light-emitting layer and the active array structure.

According to one embodiment of the present disclosure, a width of the organic light-emitting diode is approximately equal to a width of the opening.

This disclosure also provides a method of manufacturing an organic light-emitting diode display device. The method comprises the steps of: (a) providing a substrate having a first surface and a second surface opposite to the first surface; (b) forming an active array structure on the first surface; (c) forming a first protective layer to cover the active array structure: (d) forming a light-absorption layer on the second surface, the light-absorption layer having a plurality of openings exposing a portion of the second surface; (e) forming a second protective layer to cover the light-absorption layer; (f) removing the first protective layer to expose the active array structure; and (g) forming an organic light-emitting diode on the exposed active array structure.

In the foregoing, step (a) to step (g) are sequentially performed.

In the foregoing, the method further comprises: forming a protective substrate to cover the organic light-emitting diode after step (g).

In the foregoing, the method further comprises: removing the second protective layer after step (g).

In the foregoing, the first protective layer comprises a positive photoresist, and the second protective layer comprises a negative photoresist. Or, the first protective layer comprises a negative photoresist, and the second protective layer comprises a positive photoresist.

This disclosure further provides a method of manufacturing an organic light-emitting diode display device. The method comprises the steps of: (p1) providing a substrate having a first surface and a second surface opposite to the first surface; (p2) forming a light-absorption layer on the first surface, the light-absorption layer having a plurality of openings exposing a portion of the first surface; (p3) forming a protective layer to cover the light-absorption layer; (p4) forming an active array structure on the second surface; and (p5) forming an organic light-emitting diode on the active array structure.

It is to be understood that both the foregoing general description and the following detailed description are by examples, and are intended to provide further explanation of the present disclosure as claimed.

BRIEF DESCRIPTION OF THE DRAWINGS

The accompanying drawings are included to provide a further understanding of the present disclosure, and are incorporated in and constitute a part of this specification.

The drawings illustrate embodiments of the present disclosure and, together with the description, serve to explain the principles of the present disclosure. In the drawings.

DESCRIPTION OF THE EMBODIMENTS

Figure 1:
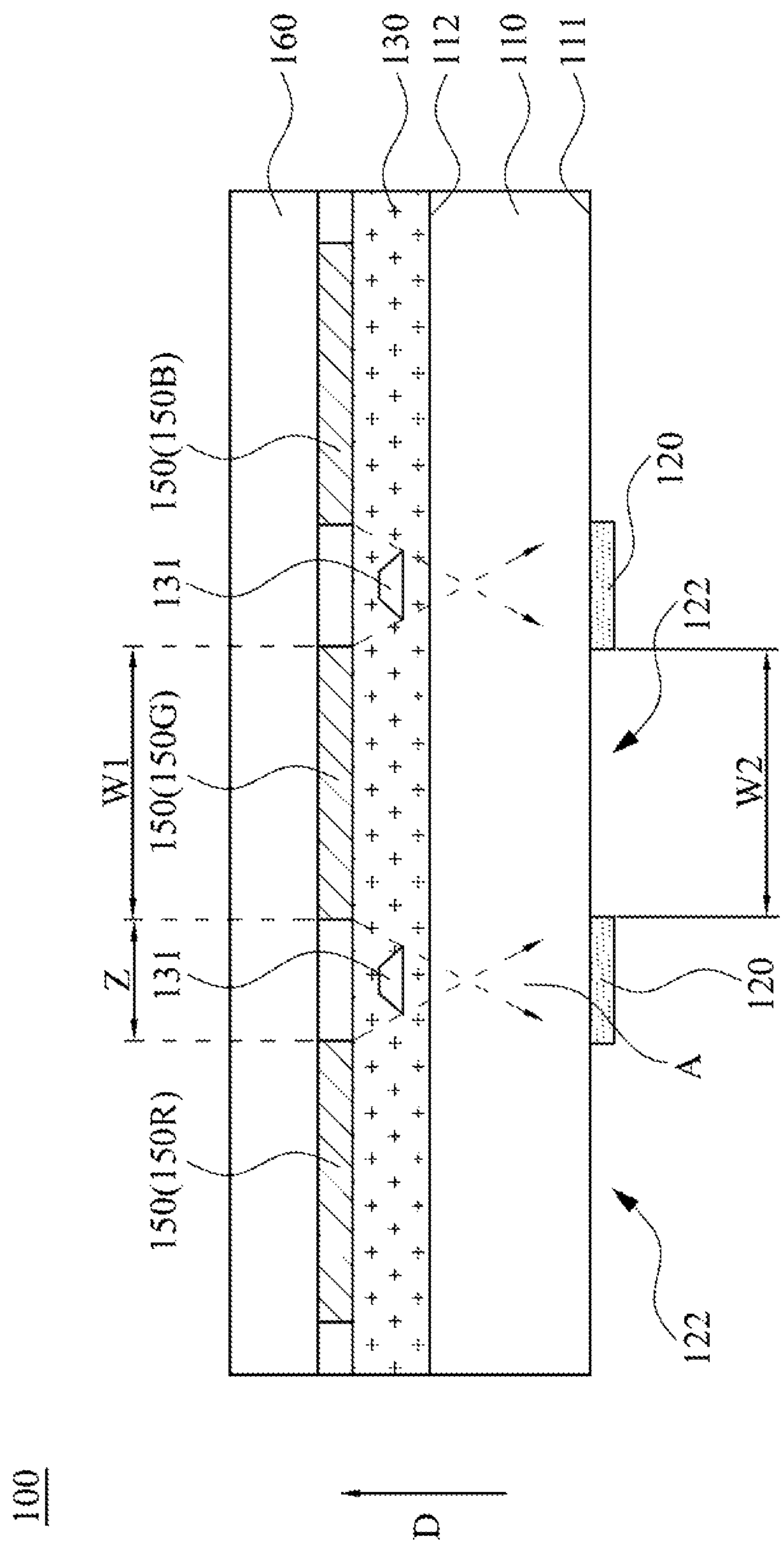
FIG. 1 is a cross-sectional view schematically illustrating an organic light-emitting diode display device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

FIG. 1 is a cross-sectional view schematically illustrating an organic light-emitting diode display device 100 according to one embodiment of the present disclosure. The organic light-emitting diode display device 100 includes a substrate 110, a light-absorption layer 120, an active array structure 130, and at least one organic light-emitting diode 150.

The substrate 110 has a first surface 111 and a second surface 112. The first surface 111 is opposite to the second surface 112. In one embodiment, the first surface 111 is approximately parallel with the second surface 112. The substrate 110 may be a rigid substrate or a flexible substrate. For example, the substrate 110 may be a glass substrate, a stainless steel substrate, a polyethylene terephthalate (PET) substrate, a polyethylene naphthalate (PEN) substrate, a polyimide substrate, a polycarbonate substrate, or an ultra-thin flexible glass substrate.

The light-absorption layer 120 is disposed on the first surface 111 of the substrate 110. The light-absorption layer 120 has at least one opening 122 exposing a portion of the first surface 111. In one embodiment, the light-absorption layer 120 can absorb light with a wavelength between approximately 380 nm and approximately 780 nm, and more specifically, between approximately 400 nm and approximately 700 nm. In one embodiment, the light-absorption layer 120 can absorb light with a wavelength of approximately 400 nm to approximately 700 nm, and the average light absorption rate is between approximately 70% and approximately 100%. In one embodiment, a pattern of the light-absorption layer 120 is arranged approximately in a matrix. In specifics, each of the openings 122 of the light-absorption layer 120 is in a rectangular shape, and each of the openings 122 approximately corresponds to one of sub-pixel areas in the organic light-emitting diode display device 100. In another embodiment, the light-absorption layer 120 is constituted by a plurality of stripe patterns, and the contour of each opening 122 is in a stripe shape. In other embodiments, the pattern of the light-absorption layer 120 is like a network. In one embodiment, the light-absorption layer 120 includes a mixture of black dye (or pigment), photoresist material, and polymeric material. In another embodiment, the light-absorption layer 120 may include a mixture of inorganic black pigment and lead borosilicate glass, and the black pigment is adhered to the substrate 110 through the lead boroslicate glass by utilizing a high temperature sintering process.

In particular, the light-absorption layer 120 is disposed on an outer surface of the organic light-emitting diode display device 100 and used for absorbing light projected from the environment to the panel of the display 100 so as to improve the quality of displayed images. In general, the substrate 110 has a smooth and flat surface, such as the first surface 111 and the second surface 112. When light is projected from the environment to the organic light-emitting diode display device 100, the flat first surface 111 and/or metal layers 131 of the active array structure 130 constitute an excellent reflecting surface. Incident light is thus reflected from the metal layers 131 and/or the first surface 111 to users, thus interfering with the image seen by users. In order to overcome the above-mentioned problem, a polarizer or an anti-reflection coating is attached to an outer surface of a display in some techniques. However, the polarizer or the anti-reflection coating will absorb the light emitted from the display, thus reducing the brightness of the display. This actually creates a big problem for organic light-emitting diode display devices. The reason is that the amount of current flowing through the organic light-emitting diode needs to be increased in order to increase the brightness of an organic light-emitting diode display device and thus reaches the required specification. However, the service lifetime of organic light-emitting diodes is considerably shortened when the amount of current flowing through the organic light-emitting diodes is increased. The present disclosure provides a solution based on the above technical concept. According to embodiments of the present disclosure, the light-absorption layer 120 is disposed on the outer surface of the organic light-emitting diode display device 100 so as to absorb light projected from the environment to the display panel, and thereby decreasing the reflective area provided for the incident light on the outer surface (that is the first surface) of the organic light-emitting diode display device 100. Additionally, the light-absorption layer 120 has a plurality of openings 122 which expose the sub-pixel areas of the panel so that light emitted from the organic light-emitting diodes 150 can be transmitted to the outside through the openings 122.

The active array structure 130 is positioned on the second surface 112 of the substrate 110, and thereby the active array structure 130 and the light-absorption layer 120 are respectively positioned on opposites sides of the substrate 110. In other words, the active array structure 130 is positioned on an inner side of the organic light-emitting diode display device 100, and the light-absorption layer 120 is positioned on the outer surface of the organic light-emitting diode display device 100.

Figure 2:
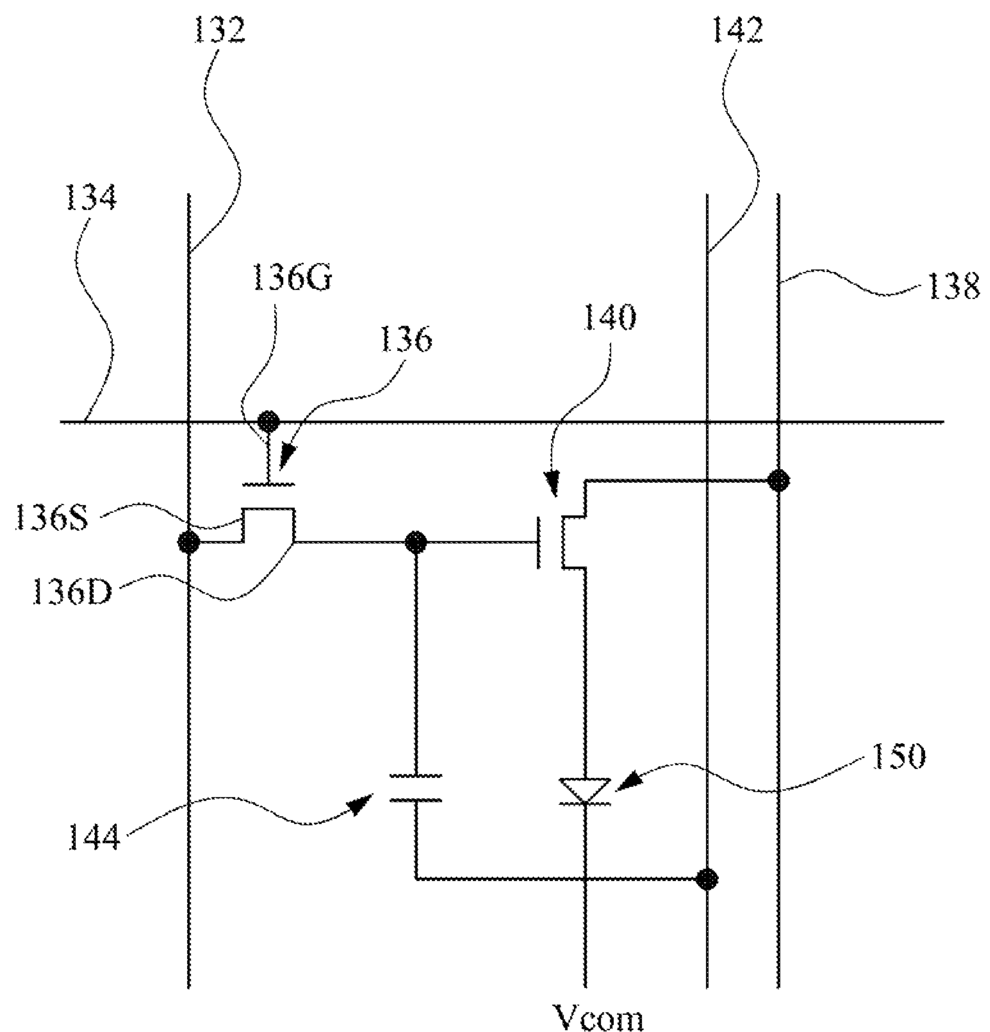
FIG. 2 is a diagram schematically illustrating a circuit configuration of an active array structure according to one embodiment of the present disclosure.

FIG. 2 depicts a schematic diagram of a circuit configuration of the active array structure 130 according to one embodiment of the present disclosure. The active array structure 130 comprises at least one data line 132, at least one gate line 134, and at least one switching device 136. In one embodiment, the switching device 136 includes a polycrystalline silicon thin film transistor, an amorphous silicon thin film transistor, or as metal-oxide thin film transistor such as an InGaZnO (IGZO) thin film transistor. The switching device 136 includes a drain electrode 136D, a source electrode 136S, and a gate electrode 136G. The switching device 136 is electrically coupled to the data line 132 and the gate line 134, and the turning on and turning off of the switching device 136 is controlled via the gate line 134. In one embodiment, the active array structure 130 further includes at least one driving line 138 and at least one driver transistor 140. The driver transistor 140 electrically interconnects the driving line 138 with the organic light-emitting diode 150. In another embodiment, the active array structure 130 further includes at least one capacitor line 142 and at least one capacitor structure 144. The capacitor structure 144 is connected to the capacitor line 142, and the drain electrode 136D of the switching device 136 is connected to the capacitor structure 144.

Figure 3:
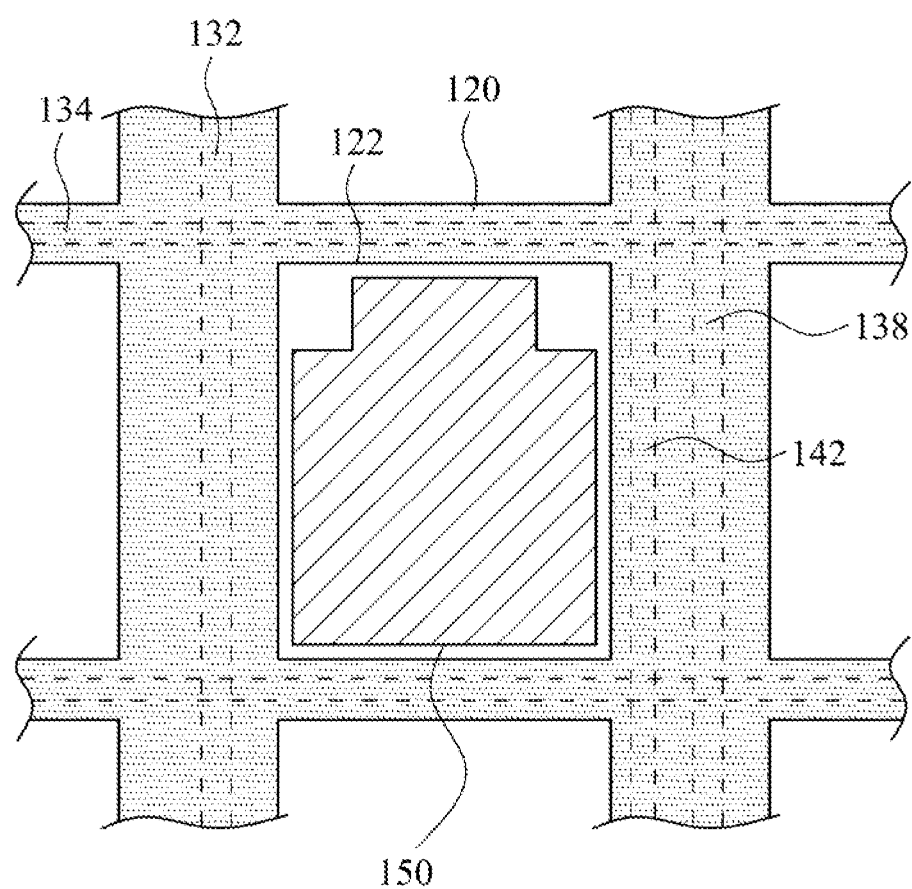
FIG. 3 is a top view schematically illustrating an active array structure and a light-absorption layer according to one embodiment of the present disclosure.

FIG. 3 is a top schematically depicting the active array structure 130 and the light-absorption layer 120 according to one embodiment of the present disclosure. In order to facilitate the reading and understanding by those of ordinary skill in the art, FIG. 3 is simplified without depicting all of the components in the active array structure 130, for example, the switching device 136, the driver transistor 140, and the capacitor structure 144 are not depicted in FIG. 3. With reference to FIG. 1 and FIG. 3, the light-absorption layer 120 overlaps at least one of patterned metal layers 131 in the active array structure 130 when viewed in a direction D perpendicular to the substrate 110. Stated differently, the projection of the light-absorption layer 120 onto the substrate 110 overlaps the projection of at least one of the patterned metal layers 131 onto the substrate 110 in a direction D perpendicular to the substrate 110. The patterned metal layer 131 may be for example, the data line 132 or the gate line 134. In other words, the light-absorption layer 120 overlaps at least one of the data line 132 and the gate line 134 when viewed in the direction D perpendicular to the substrate 110. In another embodiment, the light-absorption layer 120 overlaps the driving line 138 when viewed in the direction D perpendicular to the substrate 110, as shown in FIG. 3. In still another embodiment, the light-absorption layer 120 overlaps the capacitor line 142 when viewed in the direction D perpendicular to the substrate 110.

Referring back to FIG. 1, the organic light-emitting diodes 150 are positioned on the active array structure 130. In addition, the organic light-emitting diodes 150 overlap the openings 122 of the light-absorption layer 120 when viewed in the direction D perpendicular to the substrate 110. In the present disclosure, the term "overlap" in its meaning includes completely overlapping and partially overlapping. Additionally, although in FIG. 1 the organic light-emitting diodes 150 are located on the active array structure 130, the organic light-emitting diodes 150 may be disposed between the substrate 110 and the active array structure 130 according to other embodiments of the present disclosure. In one embodiment, the width W1 of the organic light-emitting diode 150 is approximately equal to the width W2 of the opening 122, but the present disclosure is not limited in this regard.

Typically, the organic light-emitting diode display device 100 includes a number of organic light-emitting diodes 150 such as a red organic light-emitting diode 150R, a green organic light-emitting diode 150G and a blue organic light-emitting diode 150B, as shown in FIG. 1. In order to increase the aperture ratio of the organic light-emitting diode display device 100, the distance between the two adjacent organic light-emitting diodes 150 must be reduced, for example the distance Z between the red organic light-emitting diode 150R and the green organic light-emitting diode 150G. However, when the distance between the two adjacent organic light-emitting diodes having different colors 150R, 150G is reduced, local light mixing phenomenon occurs at the adjacent portion, such as position A marked in FIG. 1, even though the two adjacent organic light-emitting diodes 150R, 150G do not overlap physically. In specifics, the position A are simultaneously irradiated by red light and green light so that color mixing undesirably occurs at the local area. According to the embodiments of the present disclosure, the light-absorption layer 120 is disposed on the first surface 111 to effectively overcome the local light mixing phenomenon. According to one or more embodiments of the present disclosure, the light-absorption layer 120 may be substantially disposed between the two adjacent sub pixels so as to block the area where light mixing occurs.

Figure 4:
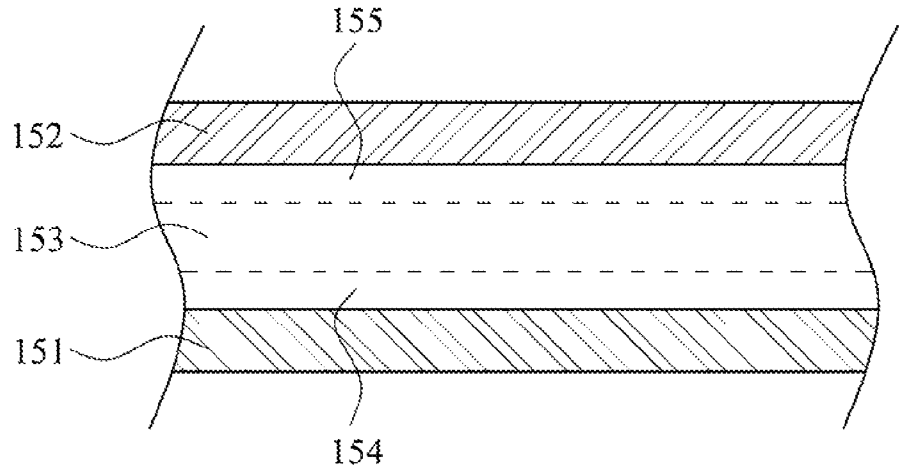
FIG. 4 is a cross-sectional view schematically illustrating an organic light-emitting diode according to one embodiment of the present disclosure.

FIG. 4 is a cross-sectional view schematically illustrating the organic light-emitting diode 150 according to one embodiment of the present disclosure. The organic light-emitting diode 150 includes a first electrode 151, a second electrode 152, and an organic light-emitting layer 153. The organic light-emitting layer 153 is disposed between the first electrode 151 and the second electrode 152. Specifically, the first electrode 151 is disposed between the organic light-emitting layer 153 and the active array structure 130. In one embodiment, the first electrode 151 of the organic light-emitting diode 150 is substantially equi-potentially connected to the active array structure 130. For example, the first electrode 151 is substantially equi-potentially connected to the driver transistor 140 depicted in FIG. 2. Hence, current flowing from the first electrode 151 first passes through the organic light-emitting layer 153, and is then transmitted to the second electrode 152. In one embodiment, the organic light-emitting diode 150 further includes a hole transport layer 154 and an electron transport layer 155, as shown in FIG. 4. The hole transport layer 154 is located between the first electrode 151 and the organic light-emitting layer 153. The electron transport layer 155 is located between the second electrode 152 and the organic light-emitting layer 153.

In one embodiment, as shown in FIG. 1, the organic light-emitting diode display device 100 further includes a protective substrate 160 disposed above the active array structure 130 and the organic light-emitting diodes 150. The protective substrate 160 and the substrate 110 may form a closed space so as to protect the active array structure 130 and the organic light-emitting diodes 150. The protective substrate 160 may be, for example, a glass substrate, a stainless steel substrate, a polyethylene terephthalate (PET) substrate, a polyethylene naphthalate (PEN) substrate, a polyimide substrate, a polycarbonate substrate, or an ultra-thin flexible glass substrate.

Figure 5:
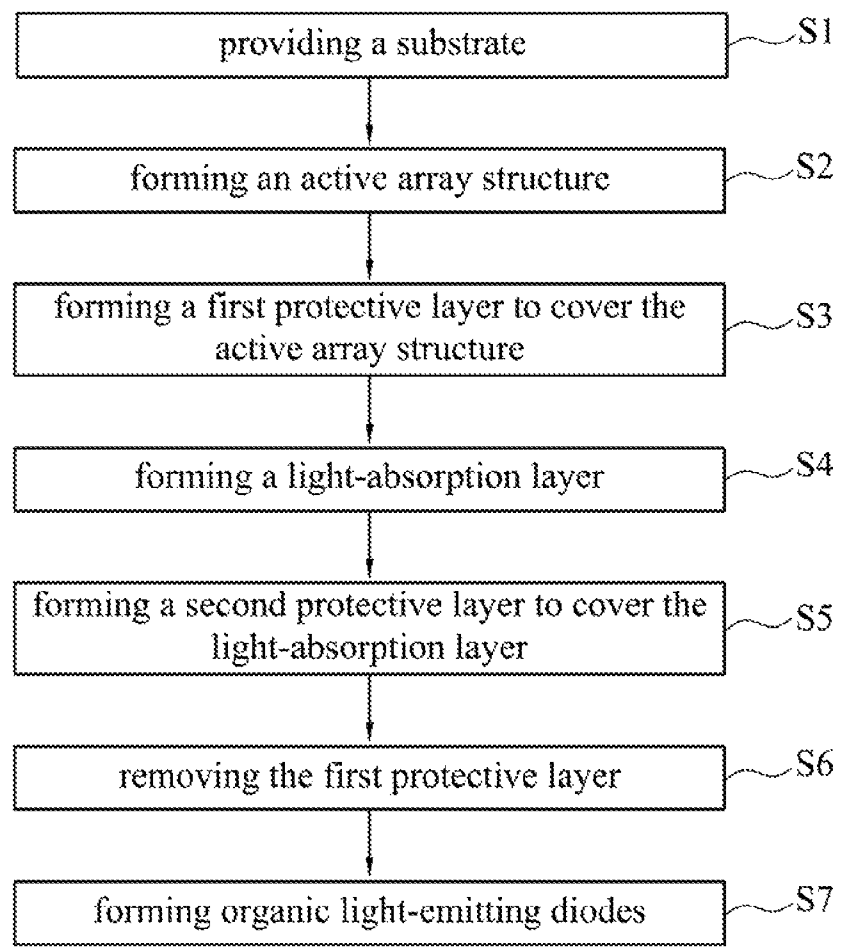
FIG. 5 is a flowchart illustrating a method of manufacturing an organic light-emitting diode display device according to one embodiment of the present disclosure.

Another aspect of the present disclosure is to provide a method of manufacturing an organic light-emitting diode display device. FIG. 5 is a flowchart illustrating a method 200 for manufacturing an organic light-emitting diode display device according to one embodiment of the present disclosure. FIG. 6A to FIG. 6E schematically depict cross-sectional views in several process stages of the method 200. As shown in FIG. 5, the method 200 includes step S1, step S2, step S3, step S4, step S5, step S6, and step S7.

Figure 6A:
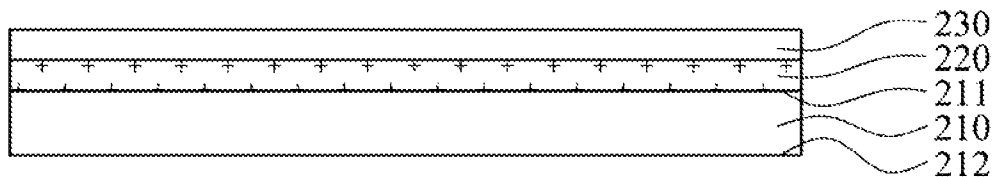
FIG. 6A to FIG. 6E are cross-sectional views schematically illustrating a method of manufacturing an organic light-emitting diode display device in various process stages according to one embodiment of the present disclosure.

In step S1, a substrate 210 is provided, as shown in FIG. 6A. The substrate 210 has a first surface 211 and a second surface 212 opposite to each other. Embodiments or methods of implementation of the substrate 210 are the same as or similar to those previously described with respect to the substrate 110.

In step S2, an active array structure 220 is formed on the first surface 211, as shown in FIG. 6A. Embodiments or methods of implementation of the active array structure 220 are the same as or similar to those previously described with respect to the active array structure 130.

In step S3, a first protective layer 230 is formed to cover the active array structure 220, as shown in FIG. 6A. The first protective layer 230 only temporarily covers the active array structure 220 since the first protective layer 230 will be removed in the subsequent step. In one embodiment, the first protective layer 230 includes a positive photoresist or a negative photoresist. In another embodiment, the first protective layer 230 may be a polymer dry film that is attached to the active array structure 220 by a rolling process.

Figure 6B:
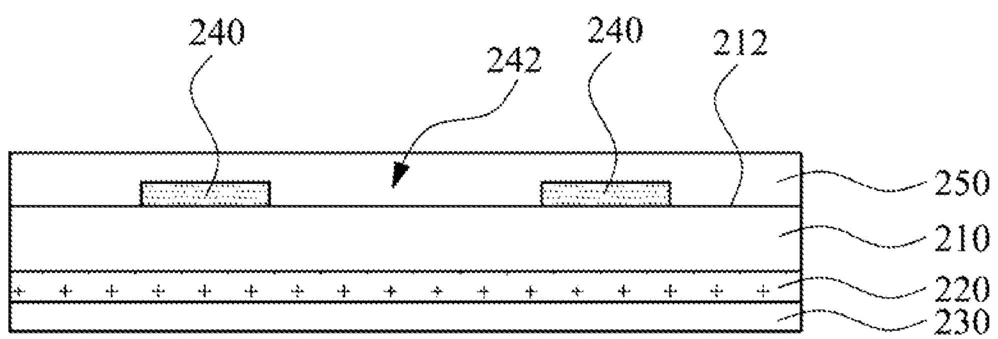

In step S4, a tight-absorption layer 240 is formed on the second surface 212, as shown in FIG. 6B. In FIG. 6B, the spatial relationship of the components is depicted by turning FIG. 6A upside down. In one embodiment, the structure formed in step S3 is turned upside down before the light-absorption layer 240 is formed so that the first protective layer 230 is underneath the substrate 210. Therefore, in the process of forming the light-absorption layer 240, the first protective layer 230 contacts machinery and equipment or a conveying carrier to avoid the active array structure 220 being damaged. In addition, the light-absorption layer 240 has a plurality of openings 242 that expose a portion of the second surface 212. Embodiments or methods of implementation of the light-absorption layer 240 are the same as or similar to those previously described with respect to the light-absorption layer 120.

In step S5, a second protective layer 250 is formed to cover the light-absorption layer 240, as shown in FIG. 6B. In one embodiment, the second protective layer 250 only temporarily covers the light-absorption layer 240 since the second protective layer 250 will be removed in the subsequent step. However, in other embodiments, the second protective layer 250 will not be removed in the subsequent step. For example, the second protective layer 250 may be an anti-scratch layer having high hardness to protect the light-absorption layer 240. In another embodiment, the second protective layer 250 includes a positive photoresist or a negative photoresist, but the type of photoresist that the second protective layer 250 has is different from the type of photoresist that the first protective layer 230 has. For example, when the first protective layer 230 includes a positive photoresist, the second protective layer 250 includes a negative photoresist. Or, when the first protective layer 230 includes a negative photoresist, the second protective layer 250 includes as positive photoresist.

Figure 6C:
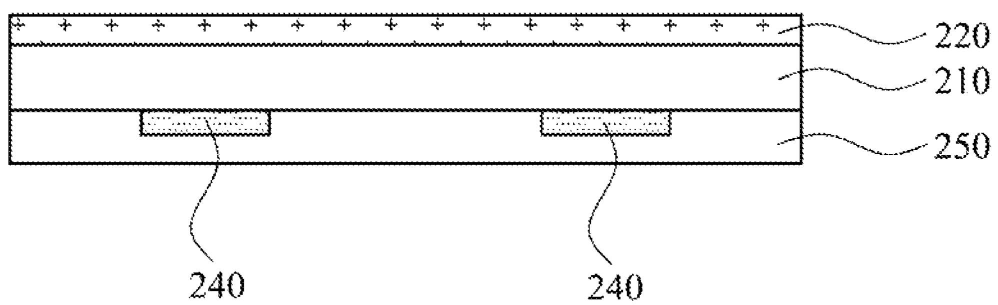

In step S6, the first protective layer 230 is removed to allow the active array structure 220 to be exposed, as shown in FIG. 6C. In FIG. 6C, the spatial relationship of the components is depicted by turning FIG. 6B upside down. The method of removing the first protective layer 230 varies depending on material characteristics of the first protective layer 230. In one embodiment, the first protective layer 230 includes a positive photoresist, and the second protective layer 250 includes a negative photoresist. Under this circumstance, a stripper suitable for the positive photoresist is utilized to remove the first protective layer 230. During the process of removing the first protective layer 230, the second protective layer 250 is not removed because the second protective layer 250 includes the negative photoresist rather than the positive photoresist. In the embodiment where the first protective layer 230 is a polymer dry film, a stripping equipment is utilized to remove the first protective layer 230.

Figure 6D:
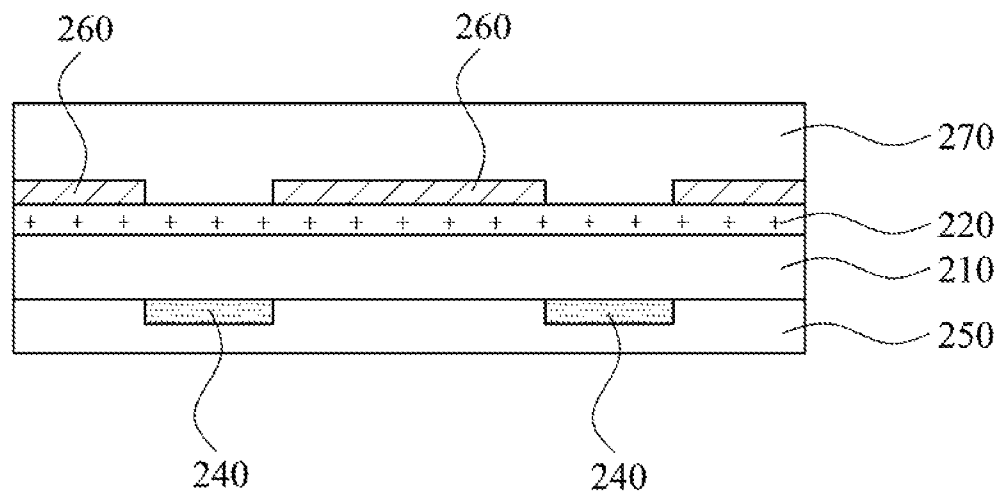

In step S7, a number of organic light-emitting diodes 260 are formed on the active array structure 220, as shown in FIG. 6D. Embodiments or methods of implementation of the organic light-emitting diode 260 are the same as or similar to those previously described with respect to the organic light-emitting diode 150.

In one embodiment, step S1 to step S7 are sequentially performed.

In another embodiment, the light-absorption layer 240 may be formed first, and then the active array structure 220 is formed. In other words, step S1, step S4, step S5, step S3, step S2, and step S7 are sequentially performed. Specifically, a substrate is provided first. The substrate has a first surface and a second surface opposite to each other. Then, a light-absorption layer is formed on the first surface. The light-absorption layer has a plurality of openings exposing the first surface. After that, a protective layer is formed to cover the light-absorption layer followed by forming an active array structure on the second surface. After the active array structure is formed, organic light-emitting diodes are formed on the active array structure. In one embodiment, the light-absorption layer may includes a mixture of inorganic black pigment and lead borosilicate glass, and the black pigment is adhered to the substrate through the lead borosilicate glass by utilizing a high temperature sintering process.

In still another embodiment, after step S7, the method 200 further includes forming a protective substrate 270 to cover the organic light-emitting diodes 260, as shown in FIG. 6D. Embodiments or methods of implementation of the protective substrate 270 are the same as or similar to those previously described with respect to the protective substrate 160.

Figure 6E:
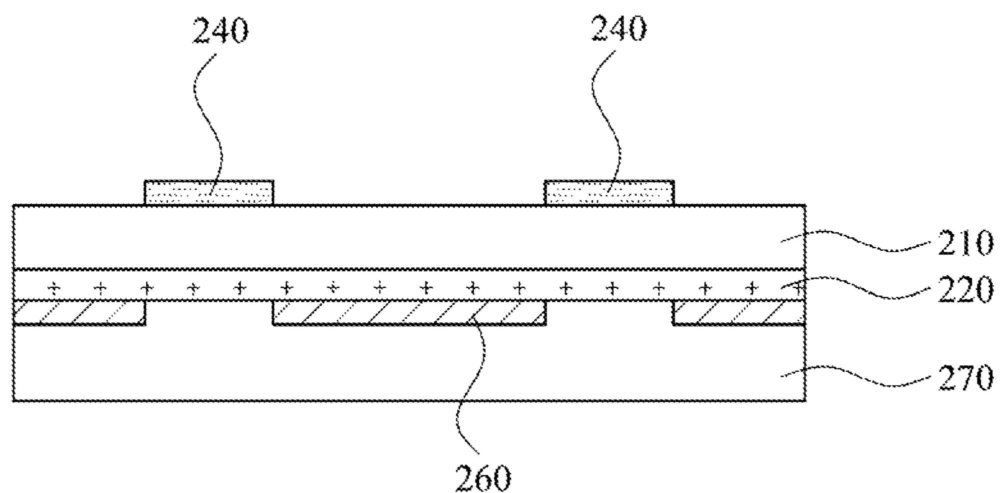

In another embodiment, after the protective substrate 270 is formed, the second protective layer 250 may be removed so that the light-absorption layer 240 is exposed as shown in FIG. 6E. In FIG. 6E, the spatial relationship of the components is depicted by turning the structure shown in FIG. 6D upside down. After the second protective layer 250 is removed, a protective layer or other films having high hardness may be formed on the light-absorption layer 240 according to some embodiments of the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims and their equivalents.

What is claimed is:

1. An organic light-emitting diode display device comprising:

a substrate having a first surface and a second surface opposite to the first surface;

a light-absorption layer disposed on the first surface, and the light-absorption layer having at test one opening exposing a portion of the first surface, wherein the light-absorption layer comprises a matrix pattern having a first stripe and a second stripe respectively extending in a first direction and a second direction, and a width of the second stripe is greater than a width of the first stripe;

an active array structure positioned on the second surface and comprising at least one data line;

at least one gate line extending in the first direction and aligned with the first stripe of the light-absorption layer;

at least one switching device electrically connected to the gate line and the data line, wherein a projection of the light-absorption layer on the substrate overlaps a projection of the data line and a projection of the gate line on the substrate in a direction perpendicular to the substrate;

at least one capacitor line;

at least one capacitor structure connected to the capacitor line, wherein the switching, device has a drain electrode connected to the capacitor structure, and the projection of the light-absorption layer on the substrate overlaps a projection of the capacitor line on the substrate in the direction perpendicular to the substrate;

at least one driver transistor; and at least one driving line electrically connected to the driving transistor, wherein both the driving line and the capacitor line extend in the second direction, and both the driving line and the capacitor line are aligned with the second stripe of the light-absorption layer; and an organic light-emitting diode electrically connected to the switching device, and a projection of the organic light-emitting diode on the substrate overlapping a projection of the opening on the substrate in the direction perpendicular to the substrate.

2. The organic light-emitting diode display device of claim 1, wherein the organic light-emitting diode comprises a first electrode, a second electrode, and an organic light-emitting layer disposed between the first electrode and the second electrode, and the first electrode is positioned between the organic light-emitting layer and the active array structure.

3. The organic light-emitting diode display device of claim 1, wherein a width of the organic light-emitting diode is approximately equal to a width of the opening.

4. A method of manufacturing an organic light-emitting diode display device comprising, the steps in sequence of:

(a) providing a substrate having a first surface and a second surface opposite to the first surface;

(b) forming an active array structure on the first surface;

(c) forming a first protective layer to cover the active array structure;

(d) forming a light-absorption layer on the second surface, the light-absorption layer having a plurality of openings exposing a portion of the second surface;

(e) forming a second protective layer to cover the light-absorption layer;

(f) removing the first protective layer to expose the active array structure; and (g) forming an organic light-emitting diode on the exposed active array structure;

wherein one of the first and second protective layers comprises a negative photoresist, and the other one of the first and second protective layers comprises a positive photoresist.

5. The method of manufacturing the organic light-emitting diode display device of claim 4, further comprising: forming a protective substrate to cover the organic light-emitting diode after step (g).

6. The method of manufacturing the organic light-emitting diode display device of claim 4, further comprising: removing the second protective layer after step (g).

* * * * *